(12) United States Patent
Nelson

(10) Patent No.: US 7,388,442 B2
(45) Date of Patent: Jun. 17, 2008

(54) DIGITALLY CONTROLLED OSCILLATOR FOR REDUCED POWER OVER PROCESS VARIATIONS

(75) Inventor: Dale H. Nelson, Macungie, PA (US)

(73) Assignee: Agere Systems Inc., Allentown, PA (US)

(*) Notice: Subject to any disclaimer, the term of this patent is extended or adjusted under 35 U.S.C. 154(b) by 120 days.

(21) Appl. No.: 11/155,824

(22) Filed: Jun. 18, 2005

(65) Prior Publication Data
US 2006/0284693 A1 Dec. 21, 2006

(51) Int. Cl.
H03B 27/00 (2006.01)

(52) U.S. Cl. .................. 331/57; 327/261; 327/263; 327/264; 327/161

(58) Field of Classification Search .................. 438/14, 438/301, 303, 289; 257/339, 344; 331/57, 331/108 C; 327/261, 264, 263
See application file for complete search history.

(56) References Cited

U.S. PATENT DOCUMENTS 6,518,075 B2 * 2/2003 Ono .......................... 438/14
7,039,885 B1 * 5/2006 Mohan ....................... 716/4

* cited by examiner

*Primary Examiner*—Arnold Kinkead
(74) *Attorney, Agent, or Firm*—Steve Mendelsohn

(57) ABSTRACT

This disclosure relates to a cell-placeable variable-frequency digitally controlled oscillator (DCO) that consumes approximately the same current in a fast process corner as in the case of a slow process corner. By modulating the effective channel length of transistors in inverters, a fast process DCO may be slowed down to a desired frequency at nearly the same current consumption as that of a slow process DCO.

28 Claims, 3 Drawing Sheets

DIGITALLY CONTROLLED OSCILLATOR FOR REDUCED POWER OVER PROCESS VARIATIONS

TECHNICAL FIELD

This invention is related in general to cell-based on chip clock generators, and in particular to digitally controlled oscillator for reduced power over process variations.

BACKGROUND

Process variations, such as mask errors in lithography and die fabrication, occur during manufacturing one batch of chips and another batch of chips, resulting in overdoping or underdoping of the components in that batch. When a batch is overdoped, it produces transistors with more current capacity because it has more carriers. These are called strong transistors because they can sink more current than the designer desired. On the other hand, an underdoped batch may result in weaker transistors because they may sink less current than the design anticipated.

"Process corner" refers to a set of conditions related to manufacturing process of an integrated circuit. Several process corners are possible, including, fast process corner, slow process corner, n-fast/p-slow corner and p-fast/n-slow corner. The transistors in a fast process corner are strong, that is, they sink more current than the design anticipated. A fast process corner produces a highest acceptable transconductance value for a transistor of a given size. On the other hand, in a slow process corner, the transistors are weak and sink less current than anticipated, and the transistors of a given size have the lowest acceptable transconductance value. In an n-fast/p-slow process corner, the N-MOS transistors sink more current than the designer anticipated, while the P-MOS transistors sink less current than expected by the design. Similarly, in a p-fast/n-slow process corner, the N-MOS sink relatively less current, while the P-MOS transistors sink relatively more current than was anticipated by the circuit design.

In a PLL, if the output frequency of a controlled oscillator (CO) is plotted against input control voltage across different corner, each corner may appear at a different slope representing different gain. But the goal is to deliver the necessary frequency range across all process corners. To achieve this result, a circuit must have more gain than optimal, that is, more gain than would be needed if process variations were not an issue. Alternatively, the power in a fast process corner may have to be reduced to nearly the same as in a slow process corner. In general, a designer configures the circuit with more gain to ensure that the full frequency range is delivered even in case of a slow process corner. A PLL so designed must operate in a stable manner in case of a fast process corner where a DCO may have more gain than the optimal solution.

One method of managing process variations is to add capacitive loads between stages and thereby creating a number of stages. Another method is to use a parallel path to change drive strength of stages. Other methods require a bias generator block but that complicates the design. Moreover, starting up a DCO with bias generator block may take time unless the bias block was always turned on, but this may not be suitable for applications where power consumption must be kept low when the DCO is stopped. All other methods, therefore, may achieve the desired frequency control, but inefficient as to power consumption or have poor starting characteristics. Accordingly there is identified a need for an improvement in the art.

SUMMARY

This disclosure relates to a cell-placeable variable-frequency digital ring oscillator that consumes approximately the same current in a fast process corner as in the case of a slow process corner. In an embodiment, a DCO includes multiple coarse delay elements forming an inverter ring with each coarse delay element coupled to multiple adjustable fine delay units. The inverter ring can be adjusted to alter an effective channel length, which can be modulated to change operating frequency. In another embodiment, a single delay control signal may be used to control all of the delay units. In a further embodiment, for a fast process DCO running at a desired frequency, one could add stages of inverters in series and slow down the DCO to a speed and nearly same current consumption as that of a slow process DCO.

In an aspect, the disclosed technique involves changing the effective channel length of a ring oscillator by effectively shorting out portions of the channel. In an embodiment, a channel of a transistor is built as a series connection of several transistors sharing a gate. A second set of switch transistors is used to short out the sections. The inverter is built from a P-channel and an N-channel composite MOS transistor of this type. One could understand this principle by starting with a simple inverter with a single N-channel transistor and a single P-channel transistor.

In a ring oscillator built from inverters in according to the principles disclosed herein, one may observe that current consumption between slow and fast process corners remains approximately the same when the channel lengths are varied. By changing the channel length one may achieve a desired speed of operation. To change channel length in an integrated circuit, one may use a composite transistor with switches. This is preferable in an integrated circuit because one is constrained from varying the channel length of a single transistor as the channel length represents a physical dimension on a mask regardless of the process corner.

Using heuristics, one may use a particular number of sections in the composite transistor. Considerations in deciding the number of sections include the accuracy with which one would like to adjust the frequency of the ring oscillator built from such an inverter. A single switch may be sufficient for a foundry with tight control of process variations. Thus, one may achieve near-uniform power consumption across process variations by controlling the effective channel lengths of the devices that form the inverters used to create the ring oscillator.

BRIEF DESCRIPTION OF THE DRAWINGS

These and other features, objects and advantages of the principles disclosed herein are more readily understood from the following detailed description with reference to the accompanying drawings, where like numbers designate like parts throughout the several views, and wherein.

DETAILED DESCRIPTION

Figure 1:
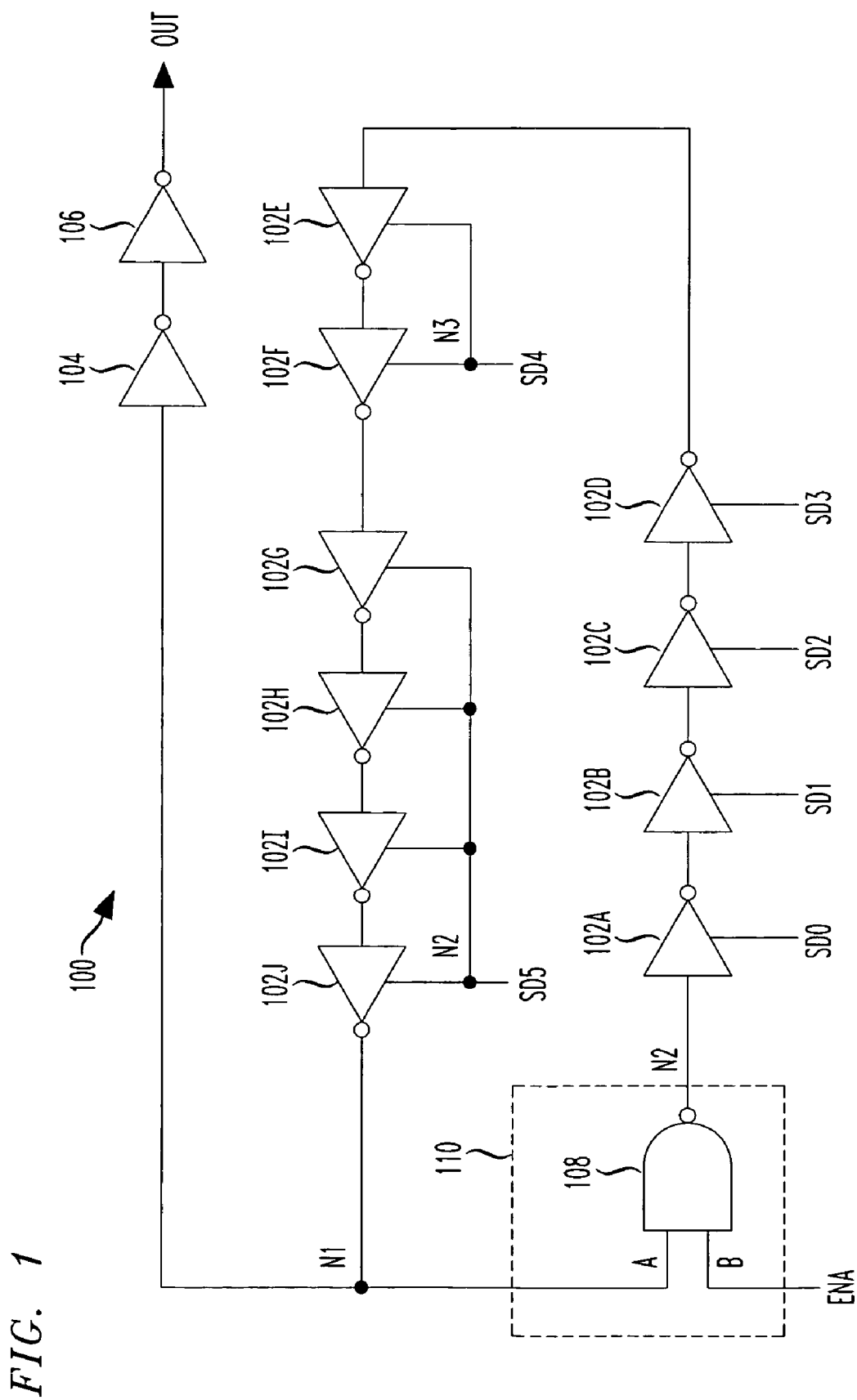
FIG. 1 shows an illustrative Voltage-controlled Ring Oscillator (VRO) 100 suitable for use in a Digital Phase Locked Loop (DPLL)

In Integrated Circuits (IC), precise timing and synchronization of one part of a circuit with another is generally accomplished with the use of local oscillators. A digitally controlled oscillator (DCO) synthesizes a frequency from a fixed time base. A DCO is capable of producing almost any frequency ratio less than half the time base frequency, in accordance with the Nyquist sampling theorem. A DCO generally includes a digital waveform generator that increments a phase counter by a per-sample increment. This phase is then looked up in a waveform table to create a sine waveform, which is sent to a digital-to-analog converter (DAC) to produce an analog waveform. An analog is sometimes used to filter this waveform, which is limited only to the precision of the arithmetic used to compute the phase.

One of the most common implementations of a DCO is in a phase locked loop (PLL). A DCO has better noise immunity compared to other types of common oscillators such as voltage-controlled oscillators (VCO), and current-controlled oscillators (ICO), and can easily maintain a desired frequency, require less redesign effort due to scaling, may have lower power dissipation, and are easy to implement using low-cost CMOS processes. A DCO, however, has the disadvantage of not being able to generate a continuous range of frequencies, but instead it produces a finite number of discrete frequencies.

A voltage-controlled oscillator (VCO) is an important basic building block in analog and digital circuits. For example, a VCO is the main building block in phase locked loop (PLL) and clock generator circuits. There are many different implementations of VCOs. One of them is the ring oscillator based VCO, which is commonly used in clock generation. A ring oscillator-based VCO uses variable bias currents to control its oscillation frequency.

A ring oscillator has an odd number of simple and identical inverters connected in series, with an output of each inverter coupled to an input of the next inverter and with the output of the last inverter coupled to the input of the first inverter. An odd number of inverters ensures that the oscillator will self-start. If a rising logic edge propagates around the ring, after one round trip, it becomes a falling edge, and after two round trips it becomes a rising edge again. If the delay of a gate is δ, then the ring oscillates at a frequency of ½δN, where N is the number of stages.

Each inverter has a pair of serially connected CMOS transistors whose output switches to a HIGH voltage, when a LOW signal is applied at the input and vice versa. Note that the logic states HIGH and LOW do not refer to any voltage levels; rather, the states refer to logic conditions. The frequency of a ring oscillator depends on the speed of the switching between the HIGH and the LOW states and vice versa from one inverter to another around the ring, and by the number of inverters. In some designs, delay logic circuits are used to achieve precise timing of an oscillator and to compensate for process variations, i.e., variations introduced in manufacturing process.

As described above, a DCO has a pulse circulating circuit formed by connecting inverters arranged in the form of a ring and generates an output signal by circulating a pulse signal. The ring is configured in discrete macro delay elements. Using this configuration, a desired operational frequency can be achieved by adjusting the multiple element paths. By increasing or decreasing the number of macro delay units, one can change the output frequency of the ring oscillator. Each of the macro delay units is coupled to a series of fine delay inverter units, each of which provides small and precise delay changes, thereby providing greater flexibility in controlling both the frequency of operation of the oscillator and the wave shape of the output signal. The DCO may be implemented in the CMOS technology as part of an IC chip using standard cell placement where a delay block includes coarse and fine delay cells to achieve a high delay resolution with minimum chip area.

FIG. 1 depicts an illustrative Voltage-controlled Ring Oscillator (VRO) 100 suitable for use in a Digital Phase Locked Loop (DPLL), in accordance with an embodiment of the device and method disclosed herein. One skilled in the art will appreciate that various alternative variable frequency generator circuits may also be employed. The VRO 100 preferably includes a plurality of delay stages 102A through 102J connected together in a ring configuration as shown, with an output of one delay stage (e.g., 102A) connected to an input of a successive delay stage (e.g., 102B), and so forth until the ring is closed. The delay stages, which may be referred to collectively as 102, are preferably inverting delay stages. It is to be understood that the VRO 100 is not limited to the particular number and/or type of delay stages shown in the illustrative embodiment thereof, although the ring preferably comprises an odd number of inversions in order to provide positive feedback for sustaining oscillation.

The VRO 100 may comprise one or more buffer stages 104 and 106 for buffering an output OUT of the VRO. Buffer stages 104 and 106 may be implemented as inverters, as shown, and therefore an even number of buffer stages (e.g., two) can be utilized in order to preserve the phase of the output signal OUT. In the exemplary VRO 100, the output signal OUT is based on an output of delay stage 102J at node N1, although the output signal may alternatively be taken from any of the delay stages 102.

VRO 100 may further include enable circuitry 110 for selectively enabling the VRO in response to a control signal ENA presented thereto. The enable circuitry 110 may comprise, for example, a NAND gate 108 connected between a first end of the ring at node N1 and a second end of the ring at node N2, such that a first input (A) of the NAND gate is connected to node N1, the enable signal ENA is applied to a second input (B) of the NAND gate, and an output of the NAND gate is connected to node N2. By way of example only, when signal ENA is at a logic low level, node N2 will be forced to a logic high level, thereby halting oscillation in the VRO 100 and forcing an output OUT of the VRO to be a logic high level. When signal ENA is at a logic high level, NAND gate 108 functions essentially as an inverter which, due to an odd number of inverting stages (e.g., 11), results in an oscillation.

The frequency of the output signal OUT of the VRO 100 is based primarily on the respective delays associated with each of the delay stages 102. The delay of one or more delay stages 102 is preferably selectively adjustable for controlling the frequency of the output signal OUT as desired. In the illustrative embodiment of the VRO 100 shown in FIG. 3, each of the delay stages 102 includes a control input for receiving a corresponding select delay signal SD0, SD1, SD2, SD3, SD4 and SD5 presented thereto. More than one delay stage may receive the same select delay signal. For example, delay stages 102E and 102F receive select delay signal SD4, and delays stages 102G, 102H, 102I and 102J receive select delay signal SD5. Each of the remaining delay stages, for example, 102A, 102B, 102C and 102D, receive separate corresponding select delay signals SD0, SD1, SD2 and SD3, respectively. In this manner, the VRO 100 may be configured such that at least a portion of the select delay signals SD0 through SD5 are weighted, such as, for example, in a binary weighting arrangement. For more precise control over the frequency of output signal OUT, the delay of each delay stage 102A through 102J may be individually controllable by a separate select delay signal, although additional control signals would be required in this instance.

By using a capacitive load at the input of each stage, the respective delays of each of the delay stages 102 may be controlled. Because the select delay signals SD0 through SD5 preferably employ binary logic levels, each of the delay stages is preferably configured to operate having one of two delays depending on the state of the select delay signal presented thereto. It is to be appreciated that various alternative methodologies are contemplated for selectively controlling the delay of a given delay stage, such as, for example, by controlling a drive strength of the delay stage based at least in part on a control signal presented thereto, as will be understood by those skilled in the art. Moreover, since the select delay signals are not limited to binary signals, a given delay stage may be configured to have more than two possible delay values. It is to be appreciated that, in accordance with another embodiment (not shown), the VRO may employ delay stages having a fixed delay associated therewith, and the number of delay stages in the ring may be selectively varied as a means of controlling the frequency of the VRO output signal.

Figure 2:
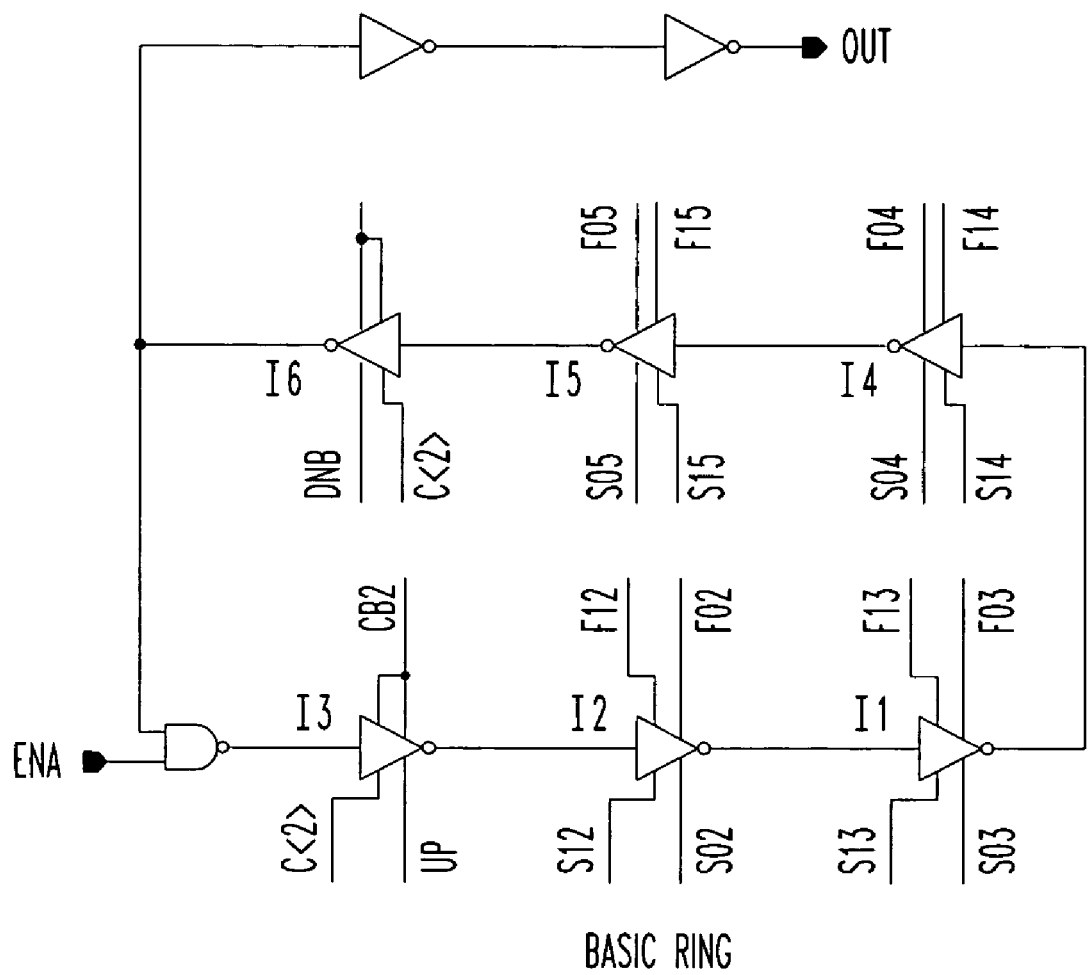
FIG. 2 is a schematic of a Variable Ring Oscillator (VRO) configured according to the principles described herein.

FIG. 2 shows an inverter ring 200 including inverters I1, I2, I3, I4, I5 and I6. Using digital inputs, the inverter ring can be controlled to cause delays of various amounts. In FIG. 2, the logic of the ring converts binary inputs C[3:0] and F[3:0] to control the inverters in the ring oscillator. Inputs C are for coarse control and the inputs F are for fine control. By using macro and micro delay units, which can be controlled by binary inputs C and F, one can fine-tune the performance of the inverter ring. Note that increasing or decreasing the number of active inverters in the ring may vary the effective channel length of the ring oscillator. Further alteration of the effective channel length may be achieved by shorting certain transistors in a composite transistor.

It has been discovered that for a fast process DCO running at a desired frequency, one could add stages of inverters in series and slow down the DCO to a speed and nearly same current consumption as that of a slow process DCO. Advantageously one may achieve this by changing the effective channel length of the DCO. Because in CMOS technology a composite transistor increases the channel length, this observation may be used to design an inverter that can have variable channel length. The composite transistor includes a series feedback loop that increases small signal output resistance and yet minimizes the voltage drop across the output of the current sink/source. By shorting portions of the composite transistor, one may alter the effective channel length and thereby alter the power consumption of an inverter.

Figure 3:
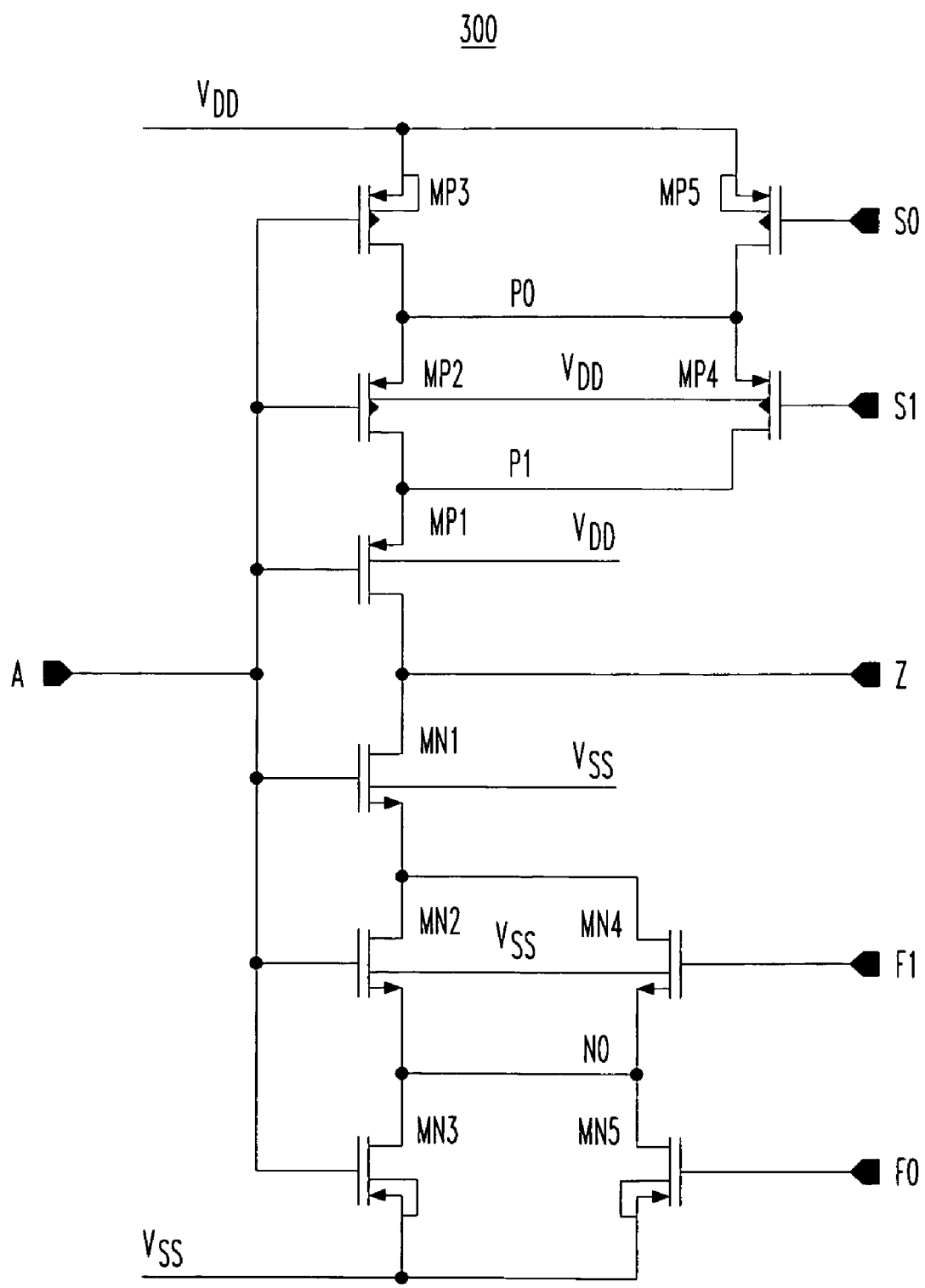
FIG. 3 shows an illustrative embodiment of a delay element configured according to the principles disclosed herein.

FIG. 3 shows illustrative embodiment of a delay element 300, for example an inverter. MP1, MP2, MP3, MP4 and MP5 are P-channel MOSFETs. MN1, MN2, MN3, MN4 and MN5 are N-channel MOSFETs. In the inverter 300, the switches are somewhat binary weighted, but the senses are inverted between S0, S1 and F0, F1. S0 signal controlling MP5 is the least change in the inverter, F0 is approximately twice the S0 change, S1 is approximately 4 times the S0 change, and F1 is approximately 8 times the S0 change. This works as follows. When S0 and S1 are changed from LOW to HIGH, it makes the P-channel MOS of the inverter use MP1, MP2, MP3 all in series, making the output low to high transitions slower. When F0 and F1 are changed from low to high, it makes the N-channel effectively only MN1, making the output high to low transition faster.

Persons of ordinary skill in the art know how to select inputs and logic to create control signals that are applied to DCO inverters from binary control words. In an embodiment, the logic steps through 16 states of each inverter progressively, doing so for inverter I2 first, then for I3, followed by I4, and I5. In an exemplary mode, controls for I1 and I6 are set to maximum delay and I2, I3, I4, I5 are set back to minimum delay and the process is repeated for the controls for I2, I3, I4, and I5 sequentially. This configuration makes it possible for the DCO to have three ranges, but monotonic in each range. There is a multiplicity of ways to step through the inverters, and if a different number of inverter stages were to be used, a different control technique would likely be required. Also, the UP/DNB signals provide direct control from the Phase-Frequency Detector outputs into controlling the speed of the DCO as outlined in a commonly owned and currently pending patent application with Docket No. Nelson 26-4. Note that other configurations may be used to apply control signals to the inverters in the ring oscillator.

The foregoing describes a method and an apparatus for changing the effective channel length of a DCO and thereby providing an integrated circuit that consumes approximately the same current or power across process variations without the need for capacitive loads to achieve the same result. Persons of ordinary skill in the art may modify or otherwise rearrange the disclosed parts without undue experimentation or without significantly departing from the spirit and scope of the inventive principles described herein. All such modifications and rearrangements should be construed to be within the scope of the following claims.

What is claimed is:

1. A method of reducing power consumption in a fast process Digitally Controlled Oscillator (DCO), comprising the steps of:
   forming an integrated circuit comprising a ring oscillator with a plurality of delay elements;
   adjusting at least one of a plurality of delay elements by short-circuiting a portion of a composite transistor in the at least one delay element to alter an effective channel length; and
   adding or subtracting the number of the plurality of delay elements such that the DCO consumes approximately the same amount of current in a fast process corner and in a slow process corner.

2. The method as in claim 1, wherein the delay elements include a coarse delay element.

3. The method as in claim 1, wherein the delay elements include a fine delay element.

4. The method as in claim 1, wherein the delay elements include an inverter.

5. The method as in claim 1, wherein the step of adjusting at least one of a plurality of delay elements further comprises the step of:
   using a delay control signal to alter the effective channel length of the ring oscillator.

6. An integrated circuit comprising:
   a Digitally Controlled Oscillator (DCO), comprising:
   a ring oscillator comprising:
   a switching transistor; and
   a plurality of delay elements communicatively coupled to the switching transistor, wherein the effective channel length of the at least one of the plurality of delay elements is adjusted by shorting out portions of the channel via the switching transistor, whereby the DCO consumes the same power in a fast process corner as in a slow process corner.

7. The integrated circuit as in claim 6, wherein the delay elements include a coarse delay element.

8. The integrated circuit as in claim 6, wherein the delay elements include a fine delay element.

9. The integrated circuit as in claim 6, wherein the plurality of delay elements includes an inverter.

10. The integrated circuit as in claim 6, wherein a delay control signal is used to alter the effective channel length of the at least one of the plurality of delay elements.

11. The integrated circuit as in claim 6, wherein a composite transistor is short circuited to alter the effective channel length of at least one delay element.

12. An integrated circuit comprising a ring oscillator comprising a ring of inverters, at least one inverter having an effective channel length and comprising:
   a plurality of channel-connected inverter transistors; and
   two or more switch transistors, each switch transistor connected in parallel to a corresponding inverter transistor, wherein:
      if a switch transistor is turned off, then the channel of the corresponding inverter transistor contributes to the effective channel length of the inverter;
      if a switch transistor is turned on, then the channel of the corresponding inverter transistor does not contribute to the effective channel length of the inverter;
      the switch state of a first switch transistor in the at least one inverter is adapted to be controlled by a first control signal; and
      the switch state of a second switch transistor in the at least one inverter is adapted to be controlled by a second control signal that is independent of the first control signal.

13. The integrated circuit as in claim 12, wherein turning on a switch transistor short-circuits the corresponding inverter transistor.

14. The integrated circuit as in claim 12, wherein turning on a switch transistor increases speed of the at least one inverter.

15. The integrated circuit as in claim 12, wherein frequency of the ring oscillator is adapted to be controlled by controlling the switch state of each switch transistor in the ring oscillator.

16. The integrated circuit as in claim 12, wherein power consumption of the ring oscillator is adapted to be controlled by controlling the switch state of each switch transistor in the ring oscillator.

17. The integrated circuit as in claim 12, wherein:
   the plurality of channel-connected inverter transistors comprises N p-type inverter transistors and N-type inverter transistors; and
   the one or more switch transistors comprise (N−1) p-type switch transistors, each connected in parallel to a corresponding p-type inverter transistor and (N−1) n-type switch transistors, each connected in parallel to a corresponding n-type inverter transistor.

18. The integrated circuit as in claim 17, wherein:
   turning on a switch transistor short-circuits the corresponding inverter transistor and increases speed of the at least one inverter; and
   frequency and power consumption of the ring oscillator are adapted to be controlled by controlling the switch state of each switch transistor in the ring oscillator.

19. The integrated circuit as in claim 12, wherein the switch states of the switch transistors in the at least one inverter are adapted to adjust output low-to-high transition speed of the at least one inverter and output high-to-low transition speed of the at least one inverter independent of one another.

20. The integrated circuit as in claim 12, wherein:
   control of a first switch transistor changes the effective channel length of the inverter by a first amount; and
   control of a second switch transistor changes the effective channel length of the inverter by a second amount different from the first amount.

21. An integrated circuit comprising a ring oscillator comprising a ring of inverters, at least one inverter having an effective channel length and comprising:
   at least six channel-connected inverter transistors; and
   at least four switch transistors, each switch transistor connected in parallel to a corresponding inverter transistor, wherein:
      if a switch transistor is turned off, then the channel of the corresponding inverter transistor contributes to the effective channel length of the inverter;
      if a switch transistor is turned on, then the channel of the corresponding inverter transistor does not contribute to the effective channel length of the inverter;
      control of a first switch transistor changes the effective channel length of the inverter by a first amount; and
      control of a second switch transistor changes the effective channel length of the inverter by a second amount different from the first amount.

22. The integrated circuit as in claim 21, wherein:
   turning on a switch transistor short-circuits the corresponding inverter transistor and increases speed of the at least one inverter; and
   frequency and power consumption of the ring oscillator are adapted to be controlled by controlling the switch state of each switch transistor in the ring oscillator.

23. The integrated circuit as in claim 21, wherein the switch state of each switch transistor in the at least one inverter is adapted to be independently controlled.

24. The integrated circuit as in claim 21, wherein control of the at least four switch transistors changes the effective channel length of the inverter in a binary manner, such that:
   control of a second switch transistor changes the effective channel length of the inverter by approximately twice as much as control of a first switch transistor;
   control of a third switch transistor changes the effective channel length of the inverter by approximately four times as much as control of the first switch transistor; and
   control of a fourth switch transistor changes the effective channel length of the inverter by approximately eight times as much as control of the first switch transistor.

25. The integrated circuit as in claim 24, wherein:
   the first and third switch transistors correspond to a first type of inverter transistor; and
   the second and fourth switch transistors correspond to a second type of inverter transistor.

26. The integrated circuit as in claim 21, wherein the switch states of the switch transistors in the at least one inverter are adapted to adjust output low-to-high transition speed of the at least one inverter and output high-to-low transition speed of the at least one inverter independent of one another.

27. An integrated circuit comprising a ring oscillator comprising a ring of inverters, at least one inverter having an effective channel length and comprising:
- a plurality of channel-connected inverter transistors; and
- one or more switch transistors, each switch transistor connected in parallel to a corresponding inverter transistor, wherein:
  - if a switch transistor is turned off, then the channel of the corresponding inverter transistor contributes to the effective channel length of the inverter;
  - if a switch transistor is turned on, then the channel of the corresponding inverter transistor does not contribute to the effective channel length of the inverter;
  - the switch state of each switch transistor in the at least one inverter is adapted to be independently controlled; and
  - the switch states of the switch transistors in the at least one inverter are adapted to adjust output low-to-high transition speed of the at least one inverter and output high-to-low transition speed of the at least one inverter independent of one another.

28. An integrated circuit comprising a ring oscillator comprising a ring of inverters, at least one inverter having an effective channel length and comprising:
- at least six channel-connected inverter transistors; and
- at least four switch transistors, each switch transistor connected in parallel to a corresponding inverter transistor, wherein:
  - if a switch transistor is turned off, then the channel of the corresponding inverter transistor contributes to the effective channel length of the inverter;
  - if a switch transistor is turned on, then the channel of the corresponding inverter transistor does not contribute to the effective channel length of the inverter; and
- the switch states of the switch transistors in the at least one inverter are adapted to adjust output low-to-high transition speed of the at least one inverter and output high-to-low transition speed of the at least one inverter independent of one another.

* * * * *